(12) United States Patent
Ku

(10) Patent No.: US 6,608,746 B2
(45) Date of Patent: Aug. 19, 2003

(54) AUTOMATIC DISCHARGE APPARATUS FOR RESIDUAL CHARGE ON AN ELECTROSTATIC CHUCK

(75) Inventor: Do-Seo Ku, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 201 days.

(21) Appl. No.: 09/800,903

(22) Filed: Mar. 8, 2001

(65) Prior Publication Data

US 2002/0030960 A1 Mar. 14, 2002

(30) Foreign Application Priority Data

Aug. 7, 2000 (KR) .......................... 2000-45601

(51) Int. Cl.[7] .............................. H02N 13/00
(52) U.S. Cl. ........................ 361/234; 279/128
(58) Field of Search .......................... 361/234, 233, 361/230, 235; 279/129, 128

(56) References Cited

U.S. PATENT DOCUMENTS 5,491,603 A * 2/1996 Birang et al. ............... 361/234
5,612,850 A * 3/1997 Birang et al. ............... 361/234
5,737,175 A * 4/1998 Grosshart et al. ........... 361/234
5,737,177 A * 4/1998 Mett et al. .................. 361/234
6,198,616 B1 * 3/2001 Dahimene et al. .......... 361/234

* cited by examiner

Primary Examiner—Rajnikant B. Patel
(74) Attorney, Agent, or Firm—Volentine Francos, PLLC

(57) ABSTRACT

An automatic discharge apparatus for an electrostatic chuck includes a high voltage determining part having an external high voltage determination value supplied thereto. A high voltage generating transformer, electrically connected to an output of the high voltage determining part, generates the high voltage to be supplied to an electrostatic chuck under control of the high voltage determining part. A high voltage controlling part, electrically connected to the high voltage generating transformer and the electrostatic chuck, controls the high voltage supplied from the high voltage generating transformer to the electrostatic chuck in response to an on/off state of power supplied by a power supply. A discharge circuit part electrically connected between the electrostatic chuck and the power supply, forcibly discharges residual voltage remaining in the electrostatic chuck in response to an off state of the power supply.

12 Claims, 1 Drawing Sheet

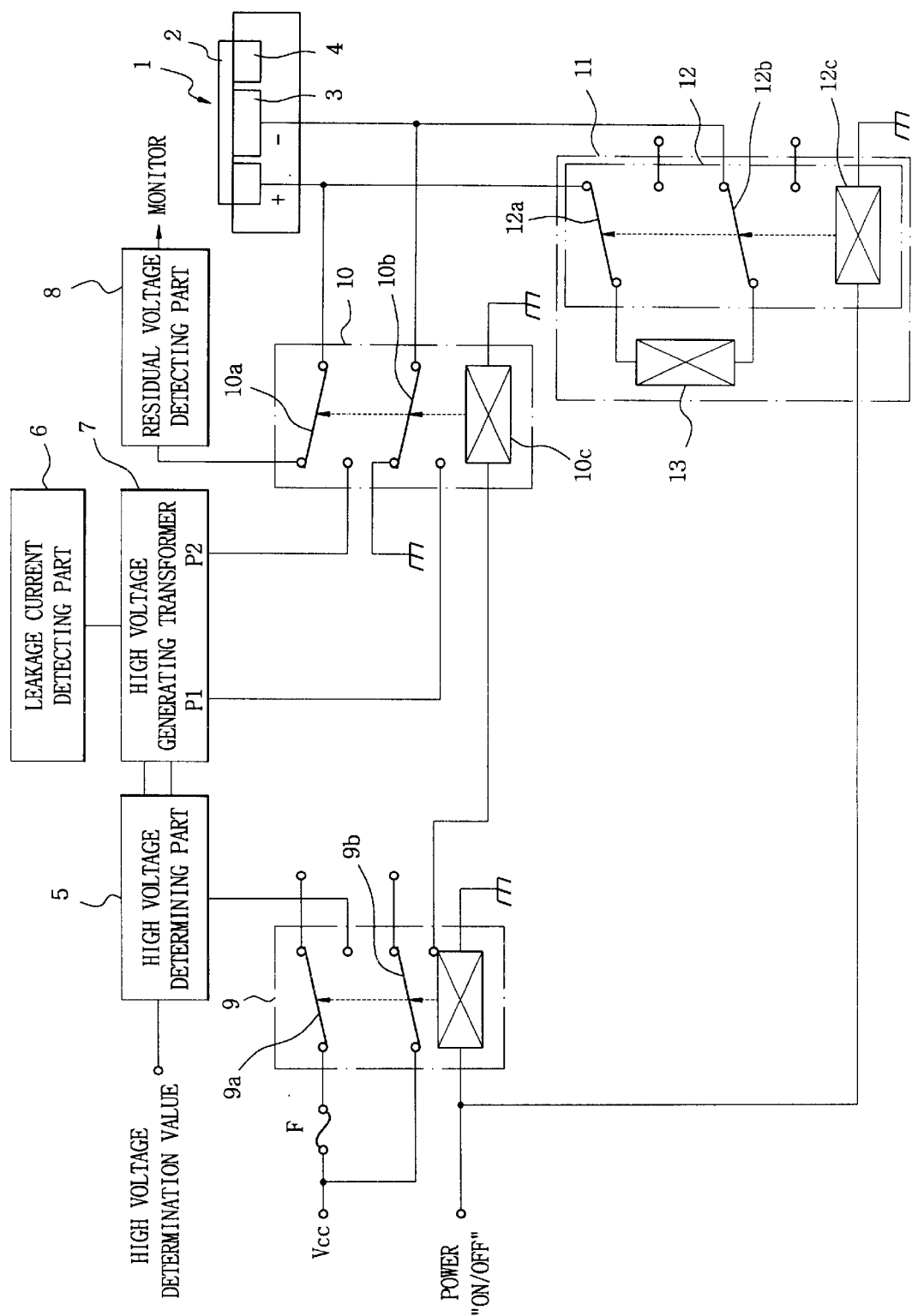

AUTOMATIC DISCHARGE APPARATUS FOR RESIDUAL CHARGE ON AN ELECTROSTATIC CHUCK

BACKGROUND OF THE INVENTION

1. Field of the Invention

The present invention relates to an automatic discharge apparatus for an electrostatic chuck used in a semiconductor manufacturing facility, and more particularly, to an automatic discharge apparatus that is capable of completely discharging any residual charge remaining on an electrostatic chuck after cutting off driving power to the electrostatic chuck.

2. Discussion of Related Art

An electrostatic chuck in a semiconductor facility is a stage on which a wafer is placed in order to manufacture a semiconductor device. The wafer is held securely in place during semiconductor manufacture (i.e., chucked) by voltage from a power supply unit.

After certain processes are performed on the wafer, the wafer must be moved to a different area or different piece of equipment to execute another process. In such cases, the driving power supplied for chucking the wafer should be intercepted, thereby allowing the wafer to be separated from the electrostatic chuck for transfer to another process area.

However, even though the driving power to the electrostatic chuck is intercepted or cut off, the wafer is not completely released due to the residual voltage remaining on the electrostatic chuck. Therefore, before the residual voltage is discharged, if an operator or piece of equipment tries to manually or automatically move the wafer, the residual voltage causes the wafer to "rebound", or be attracted back to the chuck, thereby causing the wafer to break or slip within the processing chamber.

The resulting breakage introduces foreign matter into the processing chamber, which decreases the device yields. Moreover, if wafer breakage or slippage occurs, time is lost in removing and cleaning the processing chamber, which reduces the productivity of the processing line. The decreases in both yields and productivity eventually increases the cost of manufacturing the semiconductor devices.

SUMMARY OF THE INVENTION

Accordingly, the present invention is directed to an automatic discharge apparatus for an electrostatic chuck used in a semiconductor manufacturing facility that substantially overcomes one or more of the limitations and disadvantages of the related art.

A primary object of the present invention is to provide an automatic discharge apparatus for an electrostatic chuck which is capable of completely discharging the residual voltage remaining on an electrostatic chuck after the driving power to the electrostatic chuck is cut off, thereby preventing wafer breakage or slippage during semiconductor manufacture.

Another object of the present invention is to provide an automatic discharge apparatus for an electrostatic chuck which is capable of increasing the operating capacity and yields of a semiconductor manufacturing facility.

To achieve these and other advantages, and in accordance with the purpose of the present invention, an automatic discharge apparatus for an electrostatic chuck includes a high voltage determining part having an external high voltage determination value supplied thereto; a high voltage generating transformer, electrically connected to an output of the high voltage determining part, for generating the high voltage to be supplied to an electrostatic chuck under control of the high voltage determining part; a high voltage controlling part, electrically connected to the high voltage generating transformer and the electrostatic chuck, for controlling the high voltage supplied from the high voltage generating transformer to the electrostatic chuck in response to an on/off state of power supplied by a power supply; and a discharge circuit part electrically connected between the electrostatic chuck and the power supply for forcibly discharging residual voltage remaining on the electrostatic chuck in response to an off state of the power supply.

It is desirable that the high voltage controlling part comprises a high voltage controlling relay for connecting respective output terminals of the high voltage generating transformer with a positive voltage terminal and a negative voltage terminal of the electrostatic chuck.

In addition, a residual voltage detecting part is connected to the positive voltage terminal of the electrostatic chuck, and when the power of the electrostatic chuck is cut off, detects the residual voltage of the electrostatic chuck and provides it to a monitor.

The discharge circuit part includes a discharge relay interlocked with a driving power on/off state of the electrostatic chuck, and connects the positive voltage terminal and the negative voltage terminal of the electrostatic chuck to a discharging element. The discharging element is connected to both the positive voltage terminal and the negative voltage terminal of the electrostatic chuck by way of the discharge relay, the discharging element being for discharging the residual voltage remaining in the electrostatic chuck. The discharging element may comprise a neon lamp.

BRIEF DESCRIPTION OF THE ATTACHED DRAWING

The accompanying drawing, which provides a further understanding of the invention and is incorporated in and constitutes a part of this specification, illustrates an embodiment of the invention and together with the description serve to explain the principles of the invention.

The drawing (FIG. 1) is a block diagram illustrating an automatic discharge apparatus for an electrostatic chuck used in a semiconductor manufacturing facility in accordance with the present invention.

DETAILED DESCRIPTION OF PREFERRED EMBODIMENT

Reference will now be made in detail to the preferred embodiments of the present invention, an example of which is illustrated in the accompanying drawing.

As shown in FIG. 1, a high voltage determining part 5 is connected to a high voltage generating transformer 7. A high voltage determination value from an external source is input to the high voltage determining part 5, wherein the high voltage determination value is selected and supplied to regulate the high voltage to be generated in the high voltage generating transformer 7. The high voltage generating transformer 7 generates the high voltage based on a given voltage level to be supplied to an electrostatic chuck 1 in response to a signal from the high voltage determining part 5.

A leakage current detecting part 6 connected to the high voltage generating transformer 7 detects any current leaking from the high voltage generating transformer 7 during the generation of the high voltage, and the leakage current detecting part 6 in turn provides feedback information to control the generation of the high voltage.

Output terminals P1, P2 of the high voltage generating transformer 7 are connected to respective input terminals of a high voltage controlling relay 10 comprising two relay switches 10a, 10b. The output terminals of the relay switches 10a, 10b within the high voltage controlling relay 10 are respectively connected to a ring 4 and a base 3 of the electrostatic chuck 1, to supply high voltage to the electrostatic chuck 1.

The input terminal of one of the relay switches 10b within the high voltage controlling relay 10 is connected to ground so that residual voltage flows to ground when the driving power to the electrostatic chuck 1 is intercepted or cut off. The input terminal of the other relay switch 10a is connected to a residual voltage detecting part 8. The residual voltage detecting part 8 is connected to a monitor to easily ascertain a changed state of the residual voltage when the driving power to the electrostatic chuck 1 is intercepted.

One end of a relay coil 10c housed within the high voltage controlling relay 10 is connected to ground, and the other end thereof is connected to one of the output terminals of a control relay 9, which is comprised of a pair of relay switches 9a, 9b. Another output terminal of the control relay 9 is connected to the high voltage determining part 5. One input terminal of the control relay 9 is directly connected to a given power Vcc, and the other input terminal is connected to the given power Vcc through a fuse F.

When the control relay 9 is driven by an on/off signal for supplying the driving power to the electrostatic chuck 1, the power Vcc is supplied respectively to the high voltage determining part 5 and the high voltage controlling relay 10, so as to control a generation of the high voltage and the high voltage supplied to the electrostatic chuck 1.

A discharge relay 12 is also provided. The discharge relay 12 comprises relay switches 12a, 12b and relay coil 12c. The relay coil 12c, has as an input, the on/off signal for supplying the driving power to the electrostatic chuck 1. The respective input terminals of relay switches 12a, 12b are connected to the ring 4, as the positive voltage terminal of the electrostatic chuck 1, and the base 3, as the negative voltage terminal of the electrostatic chuck 1. The output terminals of relay switches 12a, 12b are connected to a discharge element (i.e., neon lamp) 13, so as to discharge residual voltage by force through the neon lamp 13 when the driving power of the electrostatic chuck is intercepted.

In the present invention, therefore, a discharge mechanism 11, comprising a discharge relay 12 and a discharge element 13, is provided between the high voltage controlling relay 10 and the electrostatic chuck 1 to forcibly discharge the residual voltage of the electrostatic chuck after cutting off the driving power to the electrostatic chuck. As a result, the chucking state of a wafer by the electrostatic chuck is released concurrently with a cut-off of the driving power.

The operation of the novel arrangement will now be described in greater detail. Based on a high voltage determination value inputted from the outside, the high voltage determining part 5 controls a high voltage output level which is generated from the high voltage generating transformer 7, and which is thereafter supplied to the electrostatic chuck 1 through the high voltage controlling relay 10.

The high voltage generated from the high voltage generating transformer 7 is input to respective terminals of the high voltage controlling relay 10 through the output terminals P1, P2. Note that the leakage current detecting part 6 can ascertain the level of leakage current from the high voltage generating transformer 7, allowing a supervisor to determine the efficiency of the high voltage generating transformer 7, so that a re-adjustment of the high voltage determination value may be made if necessary.

When an 'On' signal to supply the driving power to the electrostatic chuck is input in such a state that the high voltage can be generated from the high voltage generating transformer 7, the controlling relay 9 is driven and the power Vcc is input directly, or alternatively input through the fuse F, to each of the high voltage determining part 5 and a relay coil 10c of the high voltage controlling relay 10.

A high voltage of a level sufficient for the electrostatic chuck is generated in the high voltage generating transformer 7 by control of the high voltage determining part 5 having an input of the power Vcc. This high voltage is then output through the output terminals P1, P2. The output terminals P1, P2 of the high voltage generating transformer 7 are electrically connected to the ring 4, as the positive voltage terminal of the electrostatic chuck 1, and the base 3, as the negative voltage terminal, through respective relay switches 10a, 10b of the high voltage controlling relay 10. In this manner, the high voltage of the high voltage generating transformer 7 is supplied to the electrostatic chuck 1. As a result, the electrostatic chuck 1 is able to safely and securely chuck a wafer 2 on top thereof.

With the wafer 2 properly chucked by the electrostatic chuck 1, a designated semiconductor device manufacturing process is executed. After that, in order to move the wafer 2 to another processing chamber, the signal supplied to the control relay 9 is changed to an "Off" signal, and the control relay 9, the high voltage controlling relay 10 and the discharge relay 12 are returned to the original state.

More specifically, the power Vcc supplied to the high voltage determining part 5 and the high voltage controlling relay 10 is blocked, and as a result, the generation of the high voltage in the high voltage generating transformer 7 is stopped. At the same time the electrical connection state is cut off between the output terminals P1, P2 of the high voltage generating transformer 7, and the ring 4 and the base 3 as the positive/negative voltage terminals of the electrostatic chuck 1. Thus, the chucking state of the electrostatic chuck 1 is released.

Concurrent with intercepting the driving power of the electrostatic chuck, and since the discharging element (i.e., neon lamp) 13 is connected to both the positive voltage terminal and the negative voltage terminal of the electrostatic chuck, the residual voltage remaining in the ring 4 and the base 3 of the electrostatic chuck 1 proceeds through the relay switches 12a, 12b of discharge relay 12 and is forced through the discharge element (i.e., neon lamp) 13, thereby lighting the lamp and discharging the residual voltage. Accordingly, the discharge time of the residual voltage remaining in the electrostatic chuck is minimized, such that the wafer 2 chucked on the electrostatic chuck 1 is released at the same time as the interception of the driving power of the electrostatic chuck 1. As a result, an operation to move the wafer 2 to another processing chamber can be smoothly performed without a breakage or a sliding of the wafer.

The high voltage controlling relay 10 and the discharge relay 12 are returned to the original state, and the ring 4 and the base 3 of the electrostatic chuck 1 are connected with the monitor and ground through the residual voltage detecting part 8. A supervisor can thus easily ascertain a changing state of current discharged from the ring 4 of the electrostatic chuck 1 through the monitor, the changing state being detected by the residual voltage detecting part 8. In summary, the present invention prevents the breakage or sliding of a wafer due to inadvertent chucking by completely discharging residual voltage remaining on an electrostatic chuck after intercepting the driving power of the electrostatic chuck. The present invention is applicable to any kind of semiconductor facility to manufacture various semiconductor devices.

In addition, the inventive apparatus increases the yield and throughput of a semiconductor manufacturing facility, thereby lowering the overall cost of manufacture.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents.

What is claimed is:

1. An automatic discharge apparatus for an electrostatic chuck comprising:

a high voltage determining part having an external high voltage determination value supplied thereto;

a high voltage generating transformer, electrically connected to an output of the high voltage determining part, for generating the high voltage to be supplied to an electrostatic chuck under control of the high voltage determining part;

a high voltage controlling part, electrically connected to the high voltage generating transformer and the electrostatic chuck, for controlling the high voltage supplied from the high voltage generating transformer to the electrostatic chuck in response to an on/off state of power supplied by a power supply; and a discharge circuit part electrically connected between the electrostatic chuck and the power supply for forcibly discharging residual voltage remaining in the electrostatic chuck in response to an off state of the power supply.

2. The automatic discharge apparatus of claim 1, wherein said high voltage controlling part comprises a high voltage controlling relay for connecting one output terminal of the high voltage generating transformer with a positive voltage terminal of the electrostatic chuck, and another output terminal of the high voltage generating transformer with a negative voltage terminal of the electrostatic chuck.

3. The automatic discharge apparatus of claim 2, wherein said high voltage controlling relay comprises a plurality of relay switches, one relay switch connecting the one output terminal of the high voltage generating transformer with the positive voltage terminal of the electrostatic chuck, and another relay switch connecting the other output terminal of the high voltage generating transformer with the negative voltage terminal of the electrostatic chuck.

4. The automatic discharge apparatus of claim 2, further comprising a residual voltage detecting part which is connected to the positive voltage terminal of the electrostatic chuck through the high voltage controlling relay, for detecting the residual voltage of the electrostatic chuck in response to an off state of the power supply.

5. The automatic discharge apparatus of claim 1, wherein said discharge circuit part comprises a discharge relay interlocked with the power supply on/off state of the electrostatic chuck.

6. The automatic discharge apparatus of claim 5, wherein said discharge circuit part comprises a plurality of relay switches and a discharging element.

7. The automatic discharge apparatus of claim 6, wherein an input of one of the plurality of relay switches is connected to a positive voltage terminal of the electrostatic chuck, and an input of the other of the plurality of relay switches is connected to a negative voltage terminal of the electrostatic chuck, wherein the outputs of each of the plurality of relay switches is connected to the discharging element, whereby residual voltage remaining in the electrostatic chuck is forced to pass through the discharging element for dissipating the residual charge.

8. The automatic discharge apparatus of claim 7, wherein said discharging element is a neon lamp.

9. The automatic discharge apparatus of claim 2, wherein said discharge circuit part comprises a discharge relay interlocked with the power supply on/off state of the electrostatic chuck.

10. The automatic discharge apparatus of claim 9, wherein said discharge circuit part comprises a plurality of relay switches and a discharging element.

11. The automatic discharge apparatus of claim 10, wherein an input of one of the plurality of relay switches is connected to the positive voltage terminal of the electrostatic chuck, and an input of the other of the plurality of relay switches is connected to the negative voltage terminal of the electrostatic chuck, wherein the outputs of each of the plurality of relay switches is connected to the discharging element, whereby residual voltage remaining in the electrostatic chuck is forced to pass through the discharging element for dissipating the residual charge.

12. The automatic discharge apparatus of claim 11, wherein said discharging element is a neon lamp.

* * * * *